United States Patent
Doller et al.

(10) Patent No.: US 10,934,160 B2
(45) Date of Patent: Mar. 2, 2021

(54) SYSTEM OF NON-ACOUSTIC SENSOR COMBINED WITH MEMS MICROPHONE

(71) Applicant: Robert Bosch GmbH, Stuttgart (DE)

(72) Inventors: Andrew Doller, Sharpsburg, PA (US); Gokhan Hatipoglu, Pittsburgh, PA (US); Yujie Zhang, Sunnyvale, CA (US); Bernhard Gehl, Wannweil (DE); Daniel Christoph Meisel, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/461,538

(22) PCT Filed: Nov. 17, 2017

(86) PCT No.: PCT/EP2017/079568
§ 371 (c)(1),
(2) Date: May 16, 2019

(87) PCT Pub. No.: WO2018/091644
PCT Pub. Date: May 24, 2018

(65) Prior Publication Data
US 2019/0352176 A1 Nov. 21, 2019

Related U.S. Application Data

(60) Provisional application No. 62/423,979, filed on Nov. 18, 2016.

(51) Int. Cl.
*B81B 7/02* (2006.01)
*B81B 7/00* (2006.01)
(Continued)

(52) U.S. Cl.
CPC .............. *B81B 7/02* (2013.01); *B81B 7/0048* (2013.01); *B81C 1/00158* (2013.01); *H04R 1/04* (2013.01);
(Continued)

(58) Field of Classification Search
CPC . B81B 7/02; B81B 7/0048; B81B 2201/0257; B81B 2201/0264;
(Continued)

(56) References Cited

U.S. PATENT DOCUMENTS 10,129,676 B2 * 11/2018 Walther ................... G01K 7/02
2005/0205951 A1 9/2005 Eskridge
(Continued)

FOREIGN PATENT DOCUMENTS

CN 1864054 A 11/2006
CN 104883652 A 9/2015

OTHER PUBLICATIONS

International Search Report corresponding to PCT Application No. PCT/EP2017/079568 dated Jun. 2, 2018 (2 pages).
(Continued)

*Primary Examiner* — Shahed Ahmed
(74) *Attorney, Agent, or Firm* — Maginot, Moore & Beck LLP

(57) ABSTRACT

A system includes a pressure sensor combined with a MEMS microphone. The pressure sensor and the MEMS microphone arranged side by side are formed on a same substrate.

13 Claims, 19 Drawing Sheets

(51) Int. Cl.
*B81C 1/00* (2006.01)
*H04R 1/04* (2006.01)
*H04R 19/00* (2006.01)

(52) U.S. Cl.
CPC .... *H04R 19/005* (2013.01); *B81B 2201/0257* (2013.01); *B81B 2201/0264* (2013.01)

(58) Field of Classification Search
CPC ........ B81C 1/00158; B81C 1/00–0092; B81C 3/00–008; B81C 2201/00–117; H04R 1/04; H04R 19/005
See application file for complete search history.

(56) References Cited

U.S. PATENT DOCUMENTS

| | | | |
|---|---|---|---|
| 2006/0197411 A1* | 9/2006 | Hoen ................... | G01P 15/097 310/320 |
| 2009/0007661 A1* | 1/2009 | Nasiri ................ | G01C 19/5769 73/504.03 |
| 2010/0107772 A1* | 5/2010 | Takizawa ................ | G01L 9/008 73/723 |
| 2014/0270271 A1 | 9/2014 | Dehe et al. | |
| 2017/0230758 A1* | 8/2017 | Kuntzman ........... | H04R 1/2873 |

OTHER PUBLICATIONS

English Translation of Chinese Office Action corresponding to Chinese Patent Application No. 201780083794.4, dated Jun. 11, 2020 (15 pages).

* cited by examiner

SYSTEM OF NON-ACOUSTIC SENSOR COMBINED WITH MEMS MICROPHONE

FIELD

This disclosure relates generally to Microelectromechanical System (MEMS) devices and, more particularly, to system of MEMS microphones combined with at least one non-acoustic sensor.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to a pressure sensor for a MEMS acoustic transducer comprises a top substrate and a bottom substrate spaced apart from each other and a driving system formed between the top substrate and the bottom substrate. The driving system comprises upper and lower diaphragms spaced apart from each other and upper and lower electrode elements suspended to the upper and lower diaphragms. The pressure sensor further comprises an insulator structure formed between the top and bottom substrates, the insulator structure being disposed outside and enclosed the electrode elements. The driving system further comprises a first isolator coupled the upper electrode element to the top substrate and a second isolator coupled the lower electrode element to the bottom substrate. The electrode elements being suspended to the substrates via the isolators. Each of the electrode element comprising a central area and an outer area, the isolators coupled the outer area of each of the electrode element to the top and bottom substrates. Each of the diaphragm and the substrate are a monolithic structure. Each of the diaphragm comprises a central portion and an outer portion, the central portion of the diaphragm is configured to deflect in response to pressure signal. A clearance for the deflection of the diaphragm is limited by at least one of the isolator or the electrode element. The substrates of the pressure sensor comprises top and bottom cavities formed within and the central portion of each of the diaphragm is exposed for receiving the pressure signal. A portion of each of the substrate is configured to support the acoustic transducer. The isolator is configured to separate and isolate the acoustic transducer from the pressure sensor. The pressure sensor and the acoustic transducer share the isolator. The remaining portion of each of the substrate is configured to support the pressure sensor.

According to another aspect of the disclosure, a combo sensor system comprises an acoustic transducer and a pressure sensor. The pressure sensor comprises a diaphragm assembly and a substrate assembly being formed as a monolithic structure, defining a driving system and an electrode element assembly suspended to the driving system. The combo sensor system further comprises an insulator structure assembly is disposed outside and enclosed the electrode element assembly. The driving system comprises an acoustic driving system and a pressure driving system. The electrode element assembly comprises a first electrode element assembly suspended to the acoustic driving system and a second electrode element assembly suspended to the pressure driving system. The insulator structure assembly comprising two openings formed within an outer wall and an inner wall for receiving at least one of driving system and the electrode element assembly, wherein the inner wall of the insulator structure assembly is configured to separate and isolate the acoustic driving system from the pressure driving system.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The disclosure is a microphone system for a client machine. Within the client machine are several other electronic components, such as sensor devices, speakers, graphical processor units, computer processor units, host systems, MEMS microphones, and any suitable computer implemented devices either directly or indirectly coupled to the microphone system. The client machine may be a personal computer or desktop computer, a laptop, a cellular or smart phone, a tablet, a personal digital assistant (PDA), a gaming console, an audio device, a video device, an entertainment device such as a television, a vehicle infotainment, a wearable device, an entertainment or infotainment remote control, a thin client system, a thick client system, or the like. Other suitable client machines regardless of size, mobility, or configuration may be suggested to include any number of microphone system.

The microphone system includes a package housing or an enclosure for housing any number of sensor devices/dies, internal components, or combination thereof. The sensor devices/dies may be such as MEMS transducers, speakers, receivers, microphones, pressure sensors, thermal sensors, optical sensors, imaging sensors, chemical sensors, gyroscopes, inertial sensors, humidity sensors, accelerometers, gas sensors, environmental sensors, motion sensors, navigation sensors, vital sensors, tunnel magnetoresistive (TMR) sensors, proximity sensors, bolometers, or combination thereof. The microphones may be electret microphones, capacitive microphones, graphene microphones, piezoelectric microphones, silicon microphones, optical microphones, or any suitable acoustic microphones.

Figure 1:
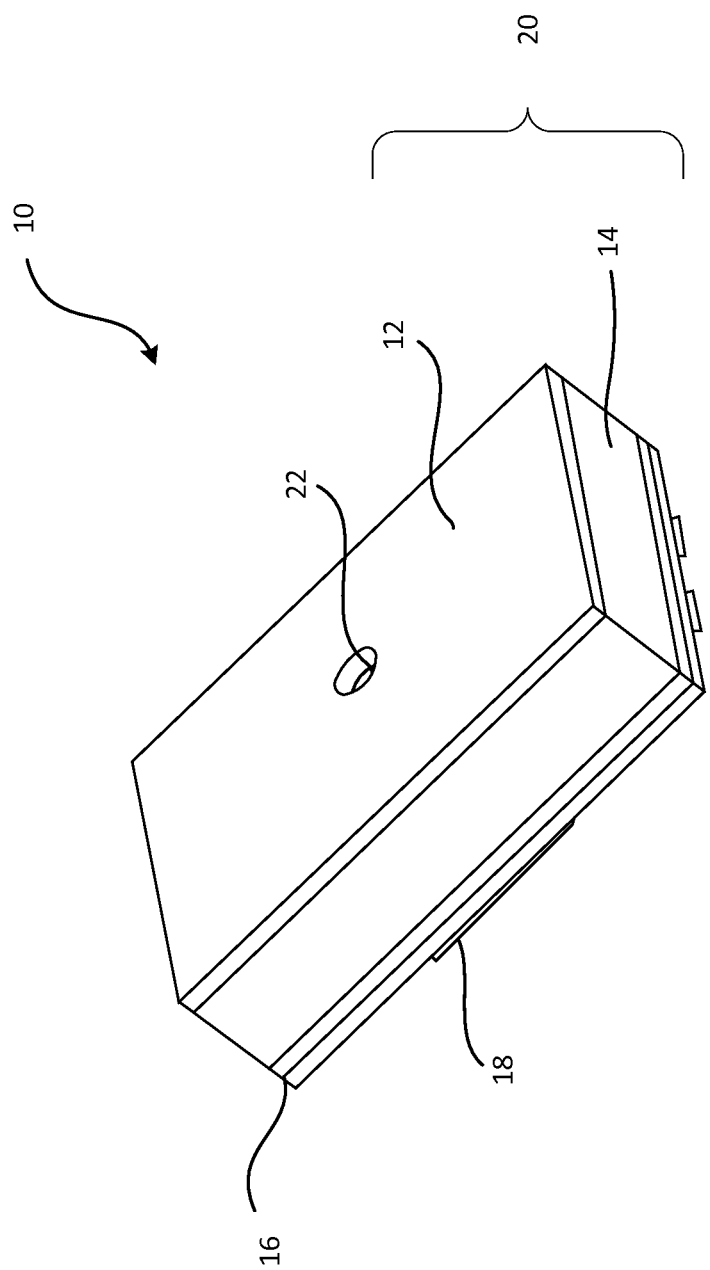
FIG. 1 is a perspective view of a microphone system in accordance with a described embodiments of a disclosure.

FIG. 1 is a perspective view of a microphone system 10 according to an embodiment of the disclosure. The MEMS microphone system 10 includes a package housing 20 having a lid 12, a spacer 14, and a substrate 16 attached to the spacer 14 by any suitable methods of attachment. More than one sensor device/die may be mounted within the microphone system 10. The sensor devices/dies may be MEMS transducers, speakers, receivers, microphones, pressure sensors, thermal sensors, optical sensors, imaging sensors, chemical sensors, gyroscopes, humidity sensors, inertial sensors, vital sensors, TMR sensors, accelerometers, gas sensors, environmental sensors, motion sensors, navigation sensors, proximity sensors, bolometers, or combination thereof. Optional components such as ASICs, integrated circuits, processors, controllers, energy storage devices, actuators, sensor circuits or any suitable circuitry may be mounted within the microphone system 10. Depending on the application, any number of opening 22 such as a port or a passageway for receiving attributes from an environment may be formed on any location of the package housing 20 by etching, piercing, drilling, punching, or any suitable methods. For example, the opening 22 may be formed on the lid 12, the substrate 16, or the spacer 14. In some embodiments, the opening 22 may be formed on multiple locations of the package housing 20. The attributes may be acoustic signal, pressure signal, optical signal, gas signal, and any suitable signal. An optional barrier may be formed within the opening 22. The bather is configured and functioned as a filter to remove debris, contamination, particles, vapor, fluid, or the like. In some embodiments, the bather may formed on the outer surface of the housing 20 to cover the opening 22 so that debris, contamination, particles, or the like cannot penetrate into the housing. In yet another embodiments, the bather may be formed below the opening 22 in which a portion of the bather is attached to the inner surface of the housing 20 for filtering or removing debris, contamination, particles, or the like. In yet embodiments, the bather may be fabricated directly onto the movable member such as a diaphragm. In yet another embodiment, the barrier is formed as a layered film or a layered material and may either be integrated into the housing 20 during fabrication, or disposed on the outer or inner surface of the housing 20. Although one bather is described, multiple layers of barrier or any suitable number of barrier may be implemented on the MEMS package, depending on the application. The bather not only functions as the particle removal while exposed to the environment via the opening 22, the bather can also serve other purposes such as a shock absorber, or a vibration damper, or combination thereof. Although the microphone system 10 as depicted comprises a multi-structure package housing 20, various aspects and configurations either in a single structure package housing, a two piece structure package housing, or multi-structure package housing may be used to encapsulate at least one internal component. As an example, the lid 12 and the spacer 14 may be formed as a single structure, defines a cover or a cap. One or more bonding pads 18 may be formed on the substrate 18, the lid 12, the spacer 14, or multiple locations of the package housing 20 by any suitable method. Once bonding pads 18 are introduced, the microphone system 10 can be easily mounted to an external printed circuit board or another support member of the client machine. In some embodiments, the package housing further includes an interposer coupled the cover 12 to either the spacer 14 or the substrate 16.

Figure 2A:
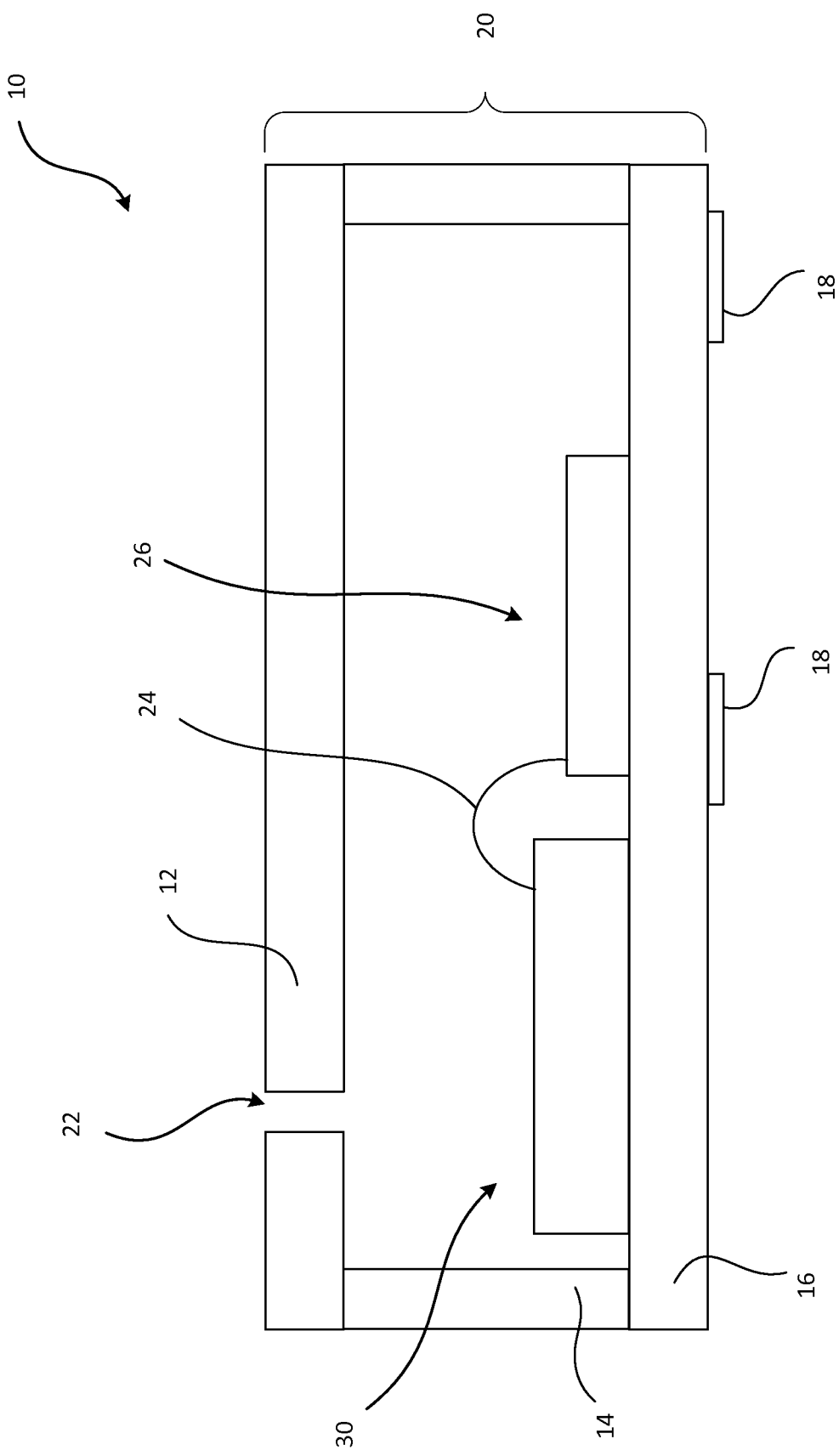
FIG. 2A is a cross-sectional view of the microphone system of FIG. 1 in accordance with a described embodiment of the disclosure.
Figure 2B:
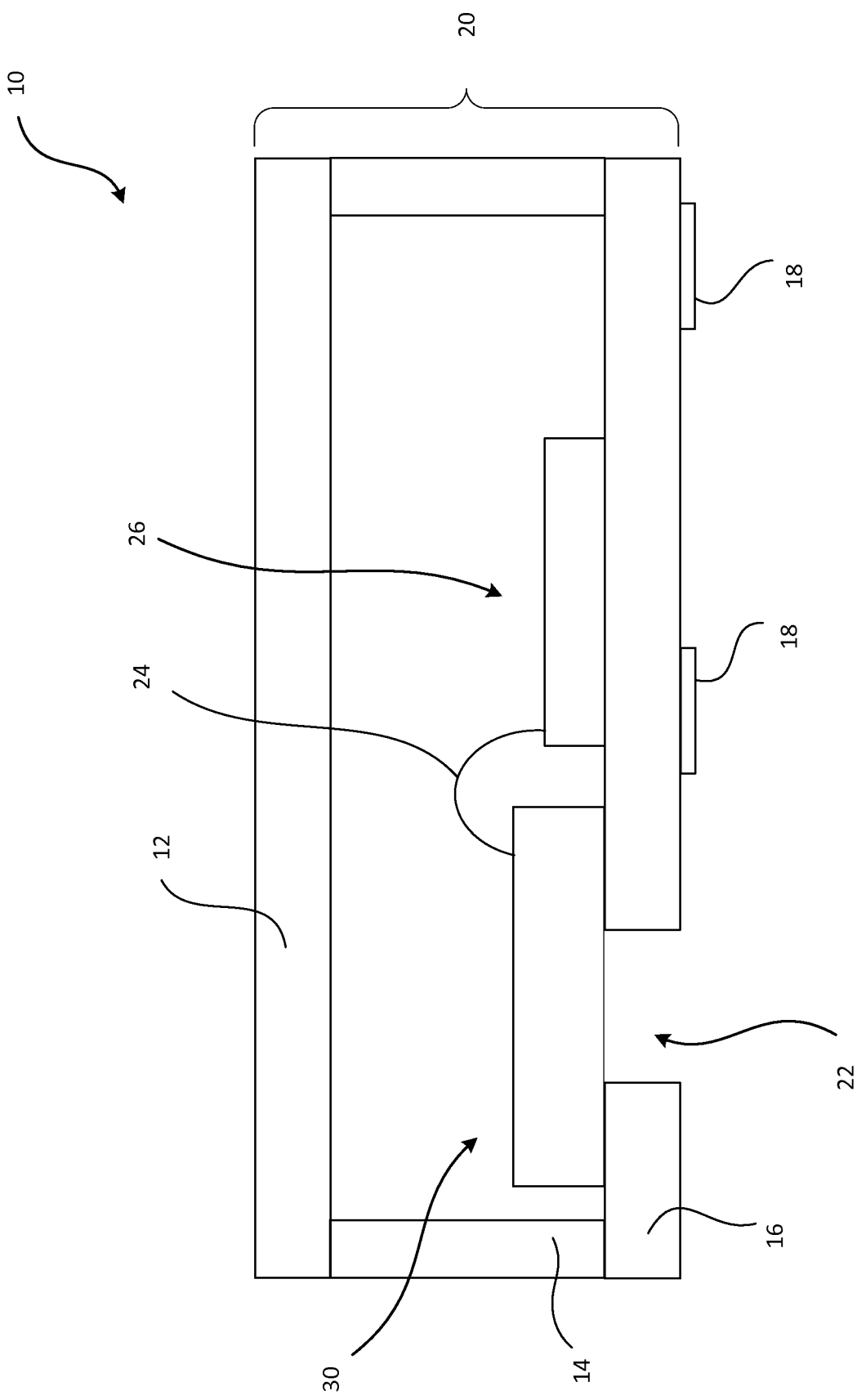
FIG. 2B is a cross-sectional view of another microphone system of FIG. 1 with a bottom port in accordance with a described embodiment of the disclosure.
Figure 2C:
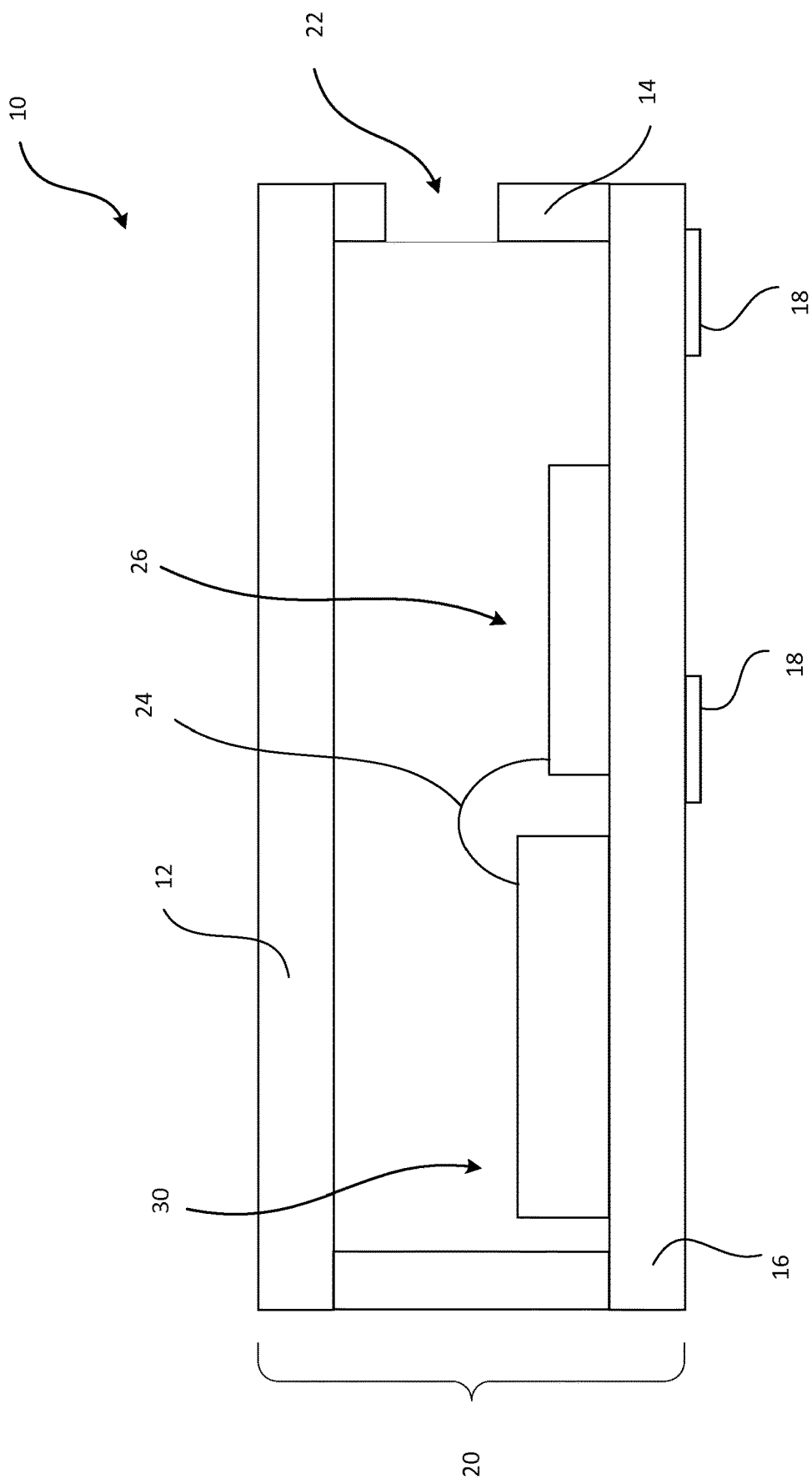
FIG. 2C is a cross-sectional view of another microphone system of FIG. 1 with a side port in accordance with a described embodiment of the disclosure.

FIGS. 2A-2C illustrate cross-sectional view of the microphone systems 10 of FIG. 1 having at least one opening 22 formed on various location of the packaging housing 20 in accordance with a described embodiment of the disclosure. The microphone system 10 includes a sensor device/die 30 and a component 26 mounted within any location of the package housing 20. An opening 22 formed on any location of the package housing 20 is adjacent to at least one of the sensor device 30 or the component 26 is provided to receive attributes or stimuli from external environment. A connection link 24 may be introduced to communicatively couple the sensor device 30 to the component 26. The connection link 24 may be wire bonding, solder-bump, solder microbump, solder ball, or any suitable connectors. In some embodiments, the connection link 24 may be a wireless communication link and the sensor device 30 is communicatively coupled to the component 26 with built-in interfaces formed in both sensor device 30 and the component 26. The wireless communicative link, for example, may be WiFi, near field communication (NFC), Zigbee, Smart WiFi, Bluetooth (BT) Qi wireless communication, ultra-wide band (UWB), cellular protocol frequency, radio frequency, or any suitable communication link. Depending on the applications, any number of sensor devices 30, components 26, or connection links 24 between the sensor devices and the components may be used. Although side-by-side configuration of the component 26 and the sensor device 30 is illustrated in FIG. 1, any suitable configurations may be possible. For example, the sensor device 30 may be placed or mounted on top of the component 26 to form a stacked configuration. In another example, the sensor device 30 may be mounted in a hole formed within the component 26 configured to receive the sensor device to form a surrounded configuration.

Figure 3A:
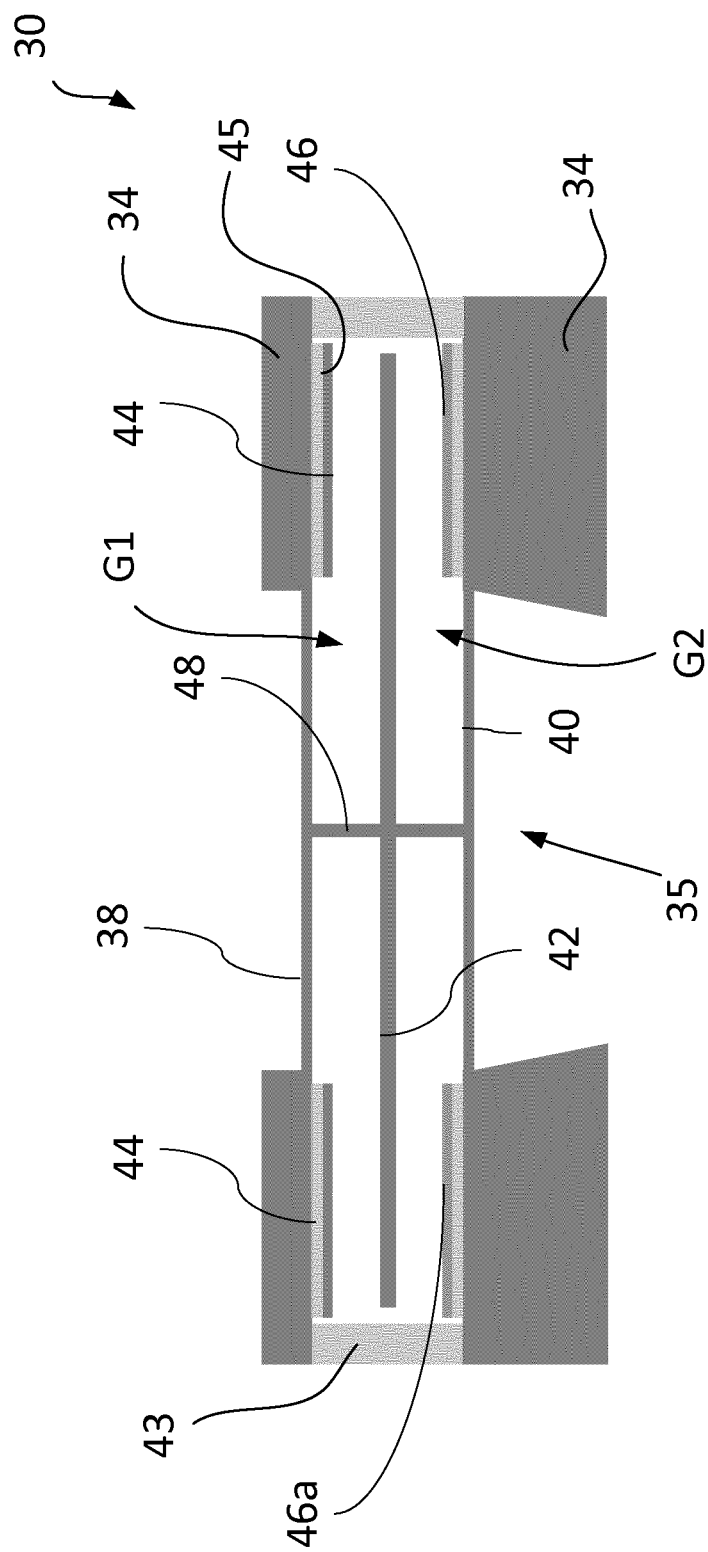
FIGS. 3A and 3B are cross-sectional views of a microphone die mounted within the microphone system of FIG. 1 and generate an output signal during operation.

FIG. 3A illustrates a cross-sectional view of a microphone die 30 mounted within the microphone system 10 of FIG. 1 in accordance with an exemplary embodiment of the disclosure. The microphone system 10 includes first diaphragm element 38, second diaphragm element 40 spaced apart from the first diaphragm element 38 and connected to the first diaphragm element 38 via a spacer 48. Disposed between the diaphragm elements 38, 40 is a plate capacitor element 42. In on embodiment, the diaphragm elements 38, 40, the spacer 48, and the plate capacitor element 42 may form an integral structure of the same material. In another embodiment, the spacer 48 and the plate capacitor element 42 may be integrally formed. Both ends of the spacer 48 are then attached to the diaphragm elements 38, 40 by any suitable attachment methods. In yet another embodiment, the spacer 48 and the diaphragm elements 38, 40 may be integrally formed and the plate capacitor element 42 formed in two sub-plate capacitor elements is attached to either body portion or outer-surface of the spacer 48 by any suitable attachment methods. In further another embodiment, a first spacer and the first diaphragm element 38 may form an integral structure. Similarly, a second spacer and the second diaphragm element 40 may form an integral structure. End portion of the first spacer is attached to a first surface of the plate capacitor element 42. Likewise, end portion of the second spacer is attached to a second surface of the plate capacitor element 42. In some embodiments, two plate capacitor elements may be separately provided and each plate capacitor element includes a spacer integrally formed therein. End portions of the spacers opposed to the plate capacitor elements may be attached to first and second diaphragm elements 38, 40 after the two plate capacitor elements are attached or laminated to form a single plate capacitor element 42. An insulator structure 43 may be formed around circumferential portions of the diaphragm elements 38, 40. Located at outer inner surfaces of the diaphragm elements 38, 40 adjacent to the insulator structure 43 are first and second diaphragm isolations 45, 47.

As illustrated in FIG. 3A, the first diaphragm isolation 45 is formed on inner surface of the first diaphragm element 38 by any suitable method of fabrications. Similarly, the second diaphragm isolation 47 is formed on inner surface of the second diaphragm element 40 by any suitable method of fabrications. In one embodiment, the first and second diaphragm isolations 45, 47 may be spaced apart from the insulator structure 43. In another embodiment, the first and second diaphragm isolations 45, 47 and the insulator structure 43 may integrally formed as a single isolator structure. In yet another embodiment, the first diaphragm isolation 45 and the insulator structure 43 may be integrally formed. In further embodiment, the second diaphragm isolation 47 and the insulator structure 43 may integrally formed. First and second electrode elements 44, 46 may be provided between the diaphragm elements 38, 40. As illustrated in FIG. 3A, the first electrode element 44 opposed to the first diaphragm element 38 is attached to the first diaphragm isolation 45 by any suitable method of attachments. Similarly, the second electrode element 46 opposed to the second diaphragm element 40 is attached to the second diaphragm isolation 47 by any suitable method of attachments. In one embodiment, the first and second electrode element 44, 46 may be spaced apart from the insulator structure 43. In another embodiment, the first and second electrode element 44, 46 coupled or attached to the first and second diaphragm isolations 45, 47, respectively also and may be coupled or attached to the insulator structure 43. In yet another embodiment, the first electrode element 44 coupled or attached to the first diaphragm isolation 45 may be spaced apart from the insulator structure 43 whereas the second electrode element 46 coupled or attached to the second diaphragm isolation 47 may be coupled or attached to the insulator structure 43. Vice versa, in some embodiments, the first electrode element 44 coupled or attached to the first diaphragm isolation 45 may be coupled or attached to the insulator structure 43 whereas the second electrode element 46 coupled or attached to the second diaphragm isolation 47 may be spaced apart from the insulator structure 43. In the example of the microphone die 10 depicted in FIG. 3A, the plate capacitor element 42 is sandwiched and spaced apart from the insulator 43, electrode elements 44, 46, and the diaphragm elements 38, 40. In one embodiment, first gap G1 may be formed between the first diaphragm element 38, first diaphragm isolation 45, the first electrode element 44, and the plate capacitor element 42. In one embodiment, second gap G2 may be formed between the second diaphragm element 40, second diaphragm isolation 47, the second electrode element 46, and the plate capacitor element 42. At least one substrate 34 may be formed on at least one of the first and second diaphragm elements 38, 40. In one embodiment, the substrate 34 may be formed on outer surface portion of the second diaphragm element 40. In another embodiment, the substrate 34 may be formed on outer surface portion of the first diaphragm element 38. An opening 35 below the second diaphragm element 40 may be formed on the substrate 34 to receive sound pressure. If a second substrate similar to the substrate 34 is provided and formed above the first diaphragm element 38, a second opening for receiving sound pressure may be formed on the substrate.

Figure 3B:
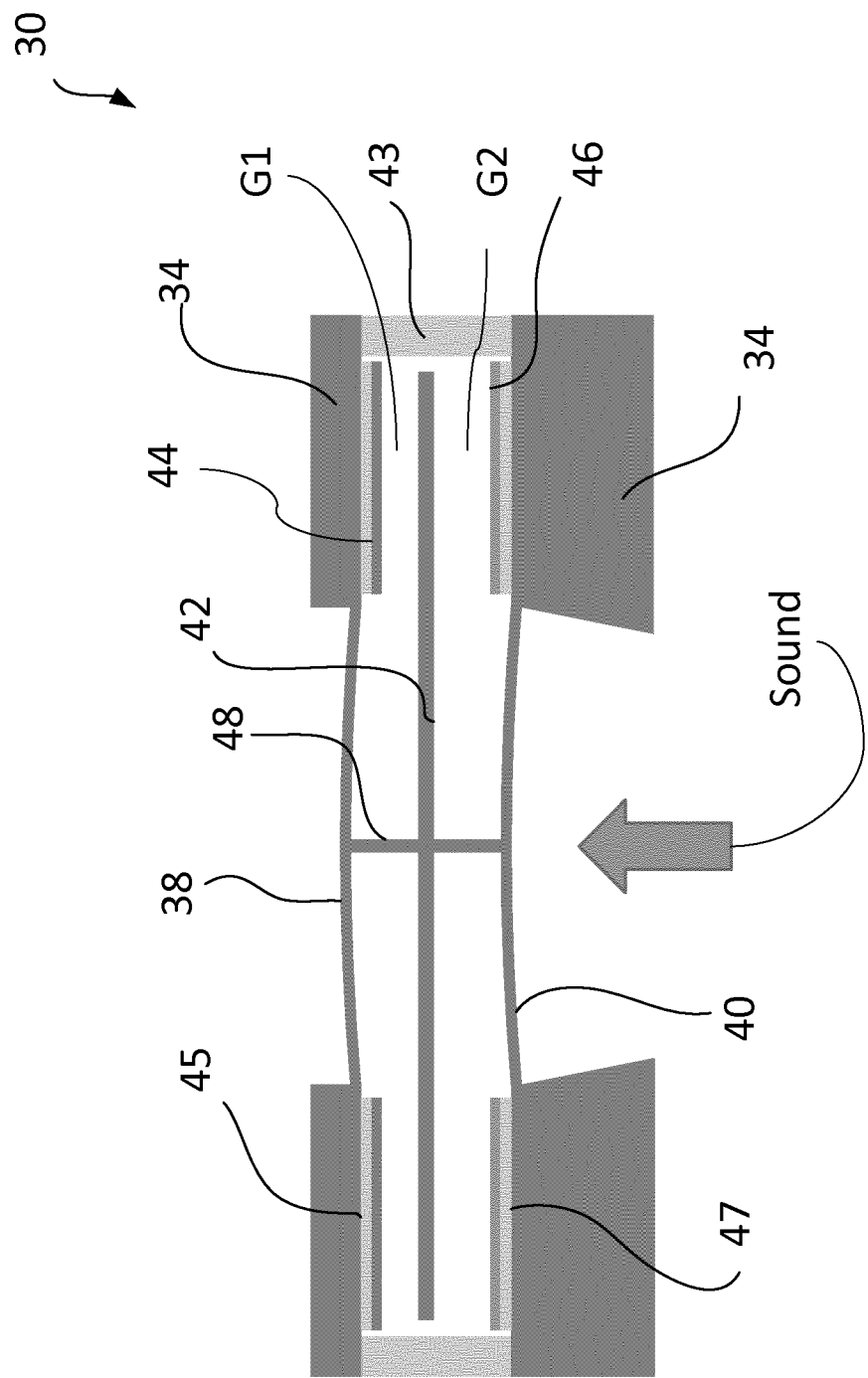

Now referring to FIG. 3B, as the sound pressure imping on the second diaphragm element 40, the second diaphragm element 40 oscillates or deforms in response to the sound pressure. This oscillation movement of the second diaphragm element 40 which in turn causes the spacer 48 having one end coupled to the second diaphragm element 40 to oscillate in the same direction. The spacer 48 having a second end coupled to the first diaphragm element 38 also oscillates in the same direction as the second diaphragm element 40. The plate capacitor element 42 oscillates in the same direction as the diaphragm elements 38, 40 and the spacer 48 as well since the plate capacitor element 42 is coupled to the diaphragm element 40 via the spacer 48. The pressure within the gaps G1, G2 changes due to the sound waves acting on the second diaphragm element 40 which results in a change in capacitance between the plate capacitor element 42 and the first electrode element 44 within G1 and between the plate capacitor element 42 and the second electrode element 46 within G2. An electrical circuit system coupled to electrode elements 44, 46 converts the change of capacitance into an electrical signal.

Figure 3C:
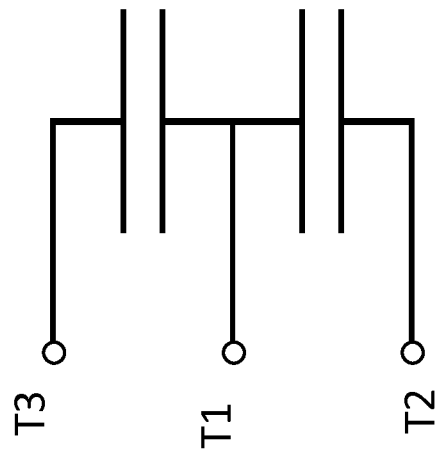
FIG. 3C is a schematic diagram of the terminals of microphone die of FIGS. 3A and 3B thereof.

FIG. 3C illustrates a schematic diagram of the microphone die 30 of FIGS. 3A and 3B having three-terminal configuration. First terminal T1 is connected to the plate capacitor element 42, second terminal T2 is connected to the electrode element 46, and third terminal T3 is connected to the electrode element 44. The terminals T1, T2, T3 are communicatively and electrically coupled to an external circuitry. In some embodiments, the terminals T1, T2, T3 may be ground terminal, output terminal, respectively. The microphone die 30 having a three-terminal configuration defines as a differential microphone and provide an improved common mode rejection. In addition, the differential microphone 30 may include higher signal to noise ratio (SNR) and higher acoustic overload point (AOP).

Figure 4B:
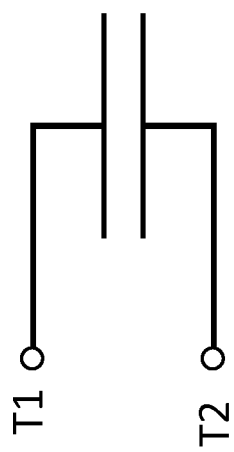
FIG. 4B is a schematic diagram of the terminals of microphone die of FIG. 4A thereof.
Figure 4A:
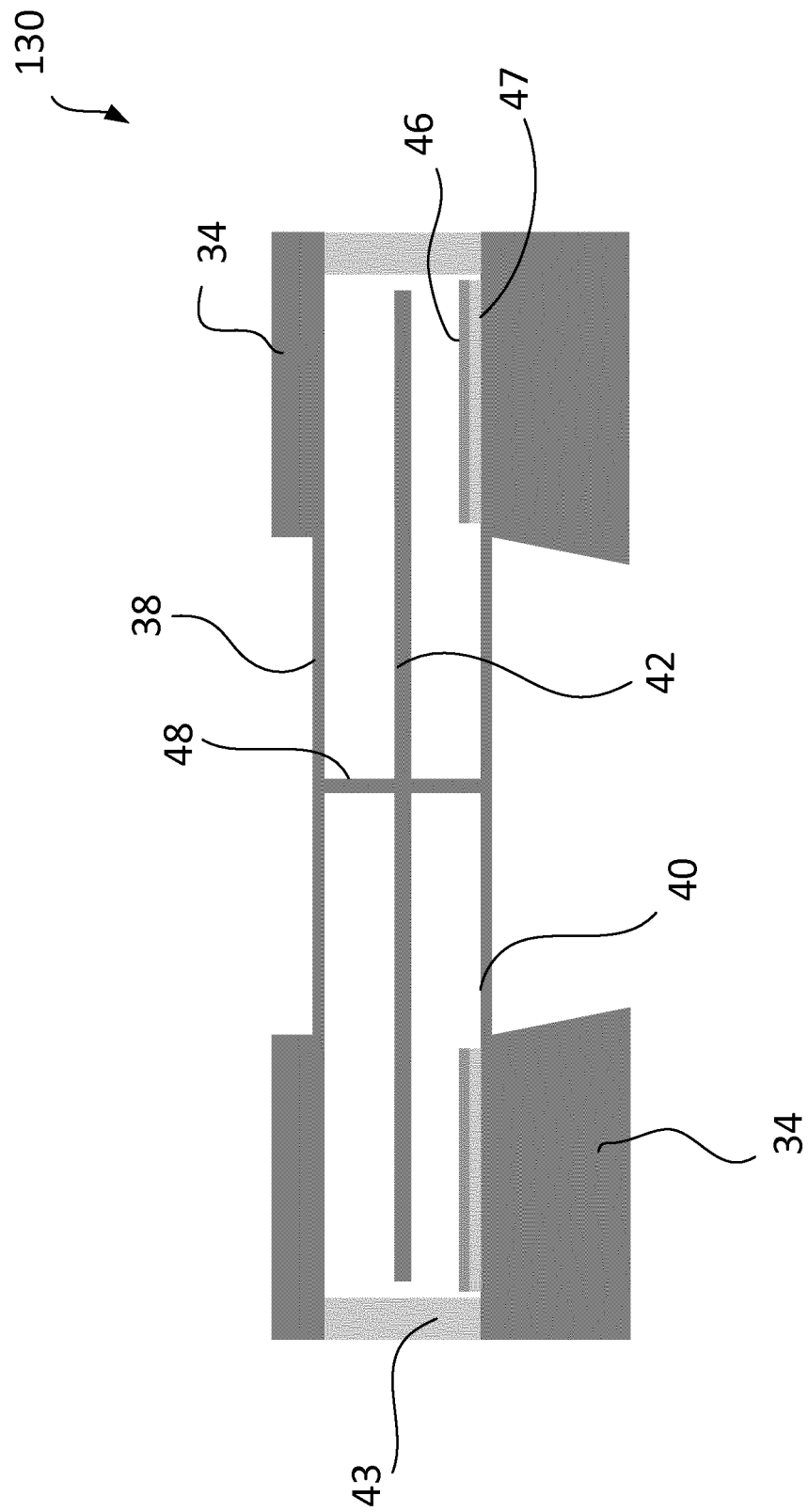
FIG. 4A is a cross-sectional view of a microphone die in accordance with another exemplary embodiment of the disclosure.

FIGS. 4A and 4B illustrate another microphone die 130 having two-terminal configuration of the disclosure defines as a single-ended microphone. The microphone die 130 is similar to the microphone die 30 illustrated in FIGS. 3A-3C except the microphone die 130 includes only one electrode element 46 formed on and isolated from the second diaphragm element 40 via an insolation 47. First terminal T1 is connected to the plate capacitor element 42 and the second terminal T2 is connected to the electrode element 46. In one embodiment, the first terminal T1 connected to the plate capacitor element 42 is a ground terminal. In another embodiment, the first terminal T1 connected to the plate capacitor element 42 is an output terminal. Similarly, if the first terminal T1 connected to the plate capacitor element 42 is a ground terminal, then the second terminal T2 connected to the electrode element 46 is the output terminal. In some embodiments, the output terminal is communicatively and electrically coupled to an external circuitry. The output of the common mode rejection, SNR, and AOP of the single-ended microphone die 130 may be lower than the output of the differential microphone, the single-ended microphone only requires a smaller footprint of an ASIC.

Figure 5A:
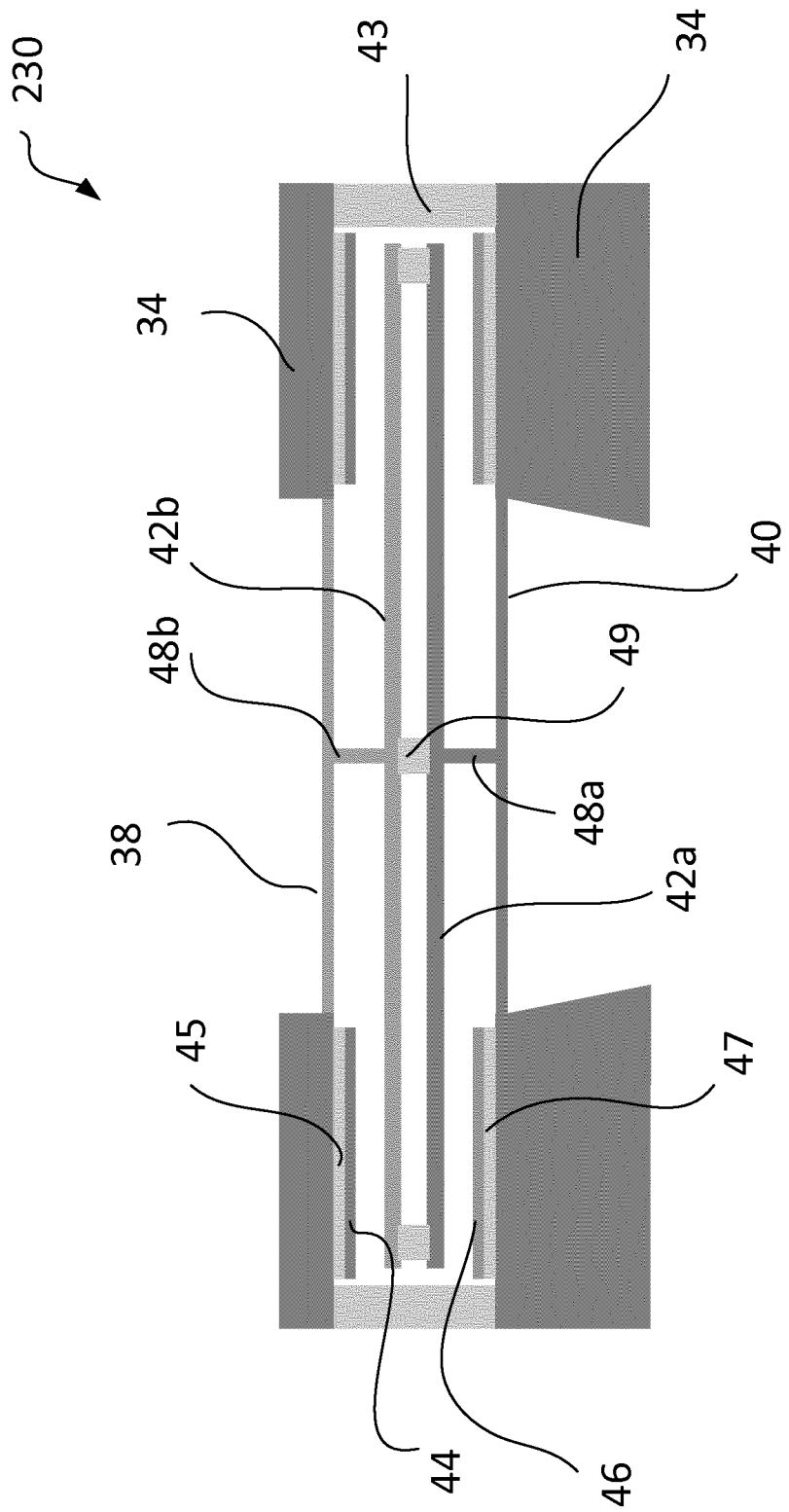
FIG. 5A is a cross-sectional view of a microphone die in accordance with another exemplary embodiment of the disclosure.
Figure 5B:
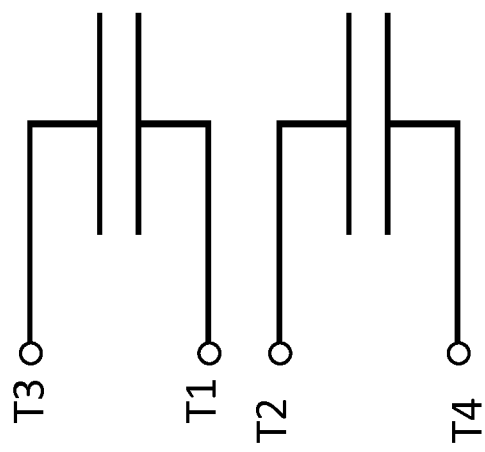
FIG. 5B is a schematic diagram of the terminals of microphone die of FIG. 4A thereof.

FIGS. 5A and 5B illustrate another microphone die 230 having two-terminal configuration of the disclosure defines as a single-ended microphone. The microphone die 230 is similar to the microphone die 30 illustrated in FIGS. 3A-3C except the microphone die 230 includes plate capacitor elements 42a, 42b spaced apart and isolated from each other via insulators 49. As depicted in FIG. 5A, the insulators 49 such as bumps, posts, or the like located between the plate capacitor elements 42a, 42b may be formed on the circumferences region and center region of the plate capacitor elements 42a, 42b. In one embodiment, the insulators 49 in a formed of a film, or a coating may be formed between the plate capacitor elements 42a, 42b and to isolate the plate capacitor elements 42a, 42b from each other.

Now referring to FIG. 5B, two terminals T1, T2 are connected to the plate capacitor elements 42a, 42b, respectively. Third terminal T3 is connected to the electrode element 44 whereas fourth terminal T4 is connected to the electrode element 46. One or more terminals T1-T4 are communicatively and electrically coupled to an external circuitry. The terminals T1-T4 may be output terminals, ground terminals, or combination thereof. T1-T4 terminal combinations can be used to utilize differential output, reduce parasitic capacitance, RF shielding and allow different ASIC structures to be connected at the output end of the microphone die.

Figure 6A:
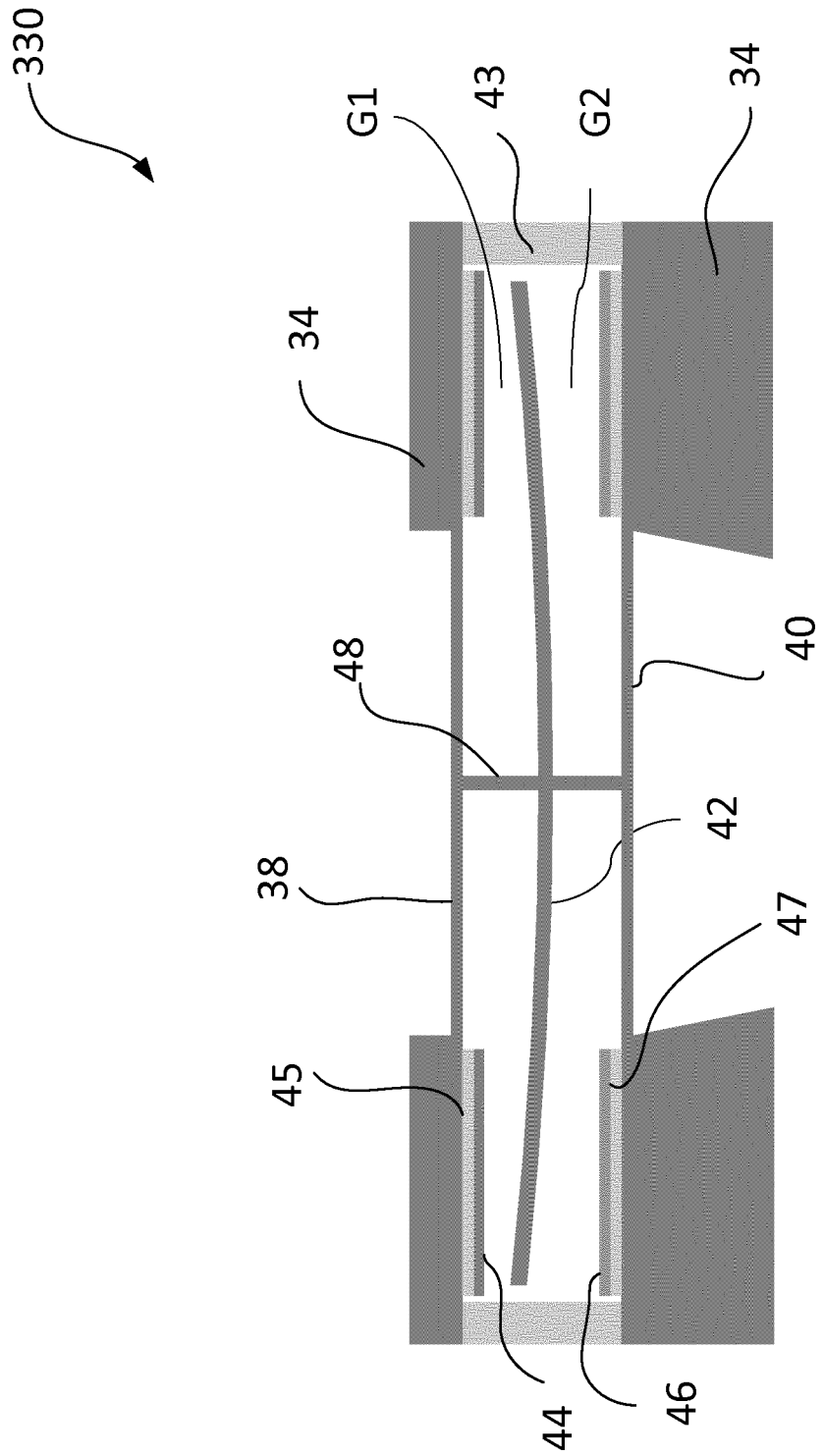
FIG. 6A is a cross-sectional view of a microphone die in accordance with another exemplary embodiment of the disclosure.
Figure 6B:
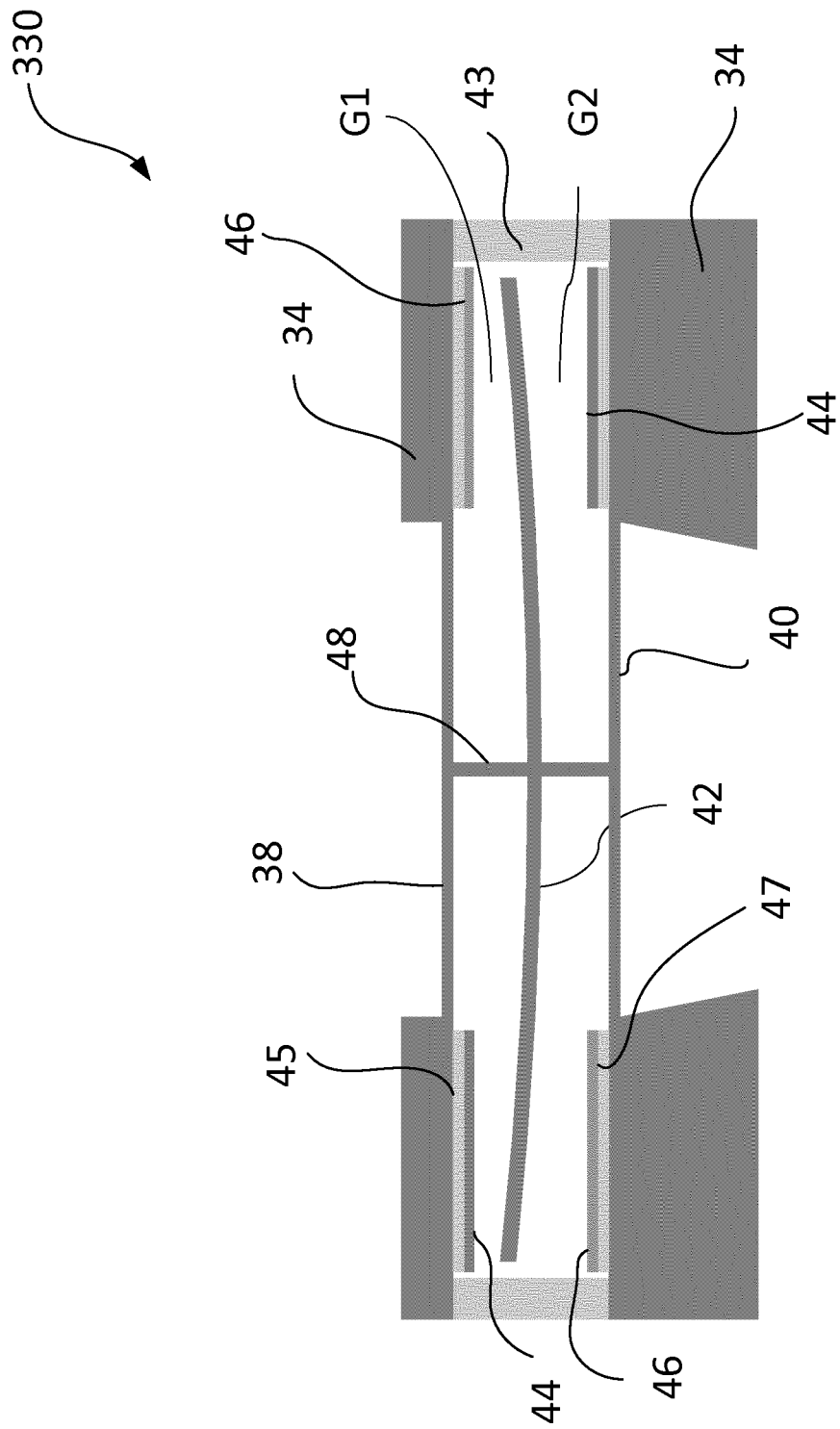
FIG. 6B is a cross-sectional view of of a microphone die in accordance with another exemplary embodiment of the disclosure.
Figure 6C:
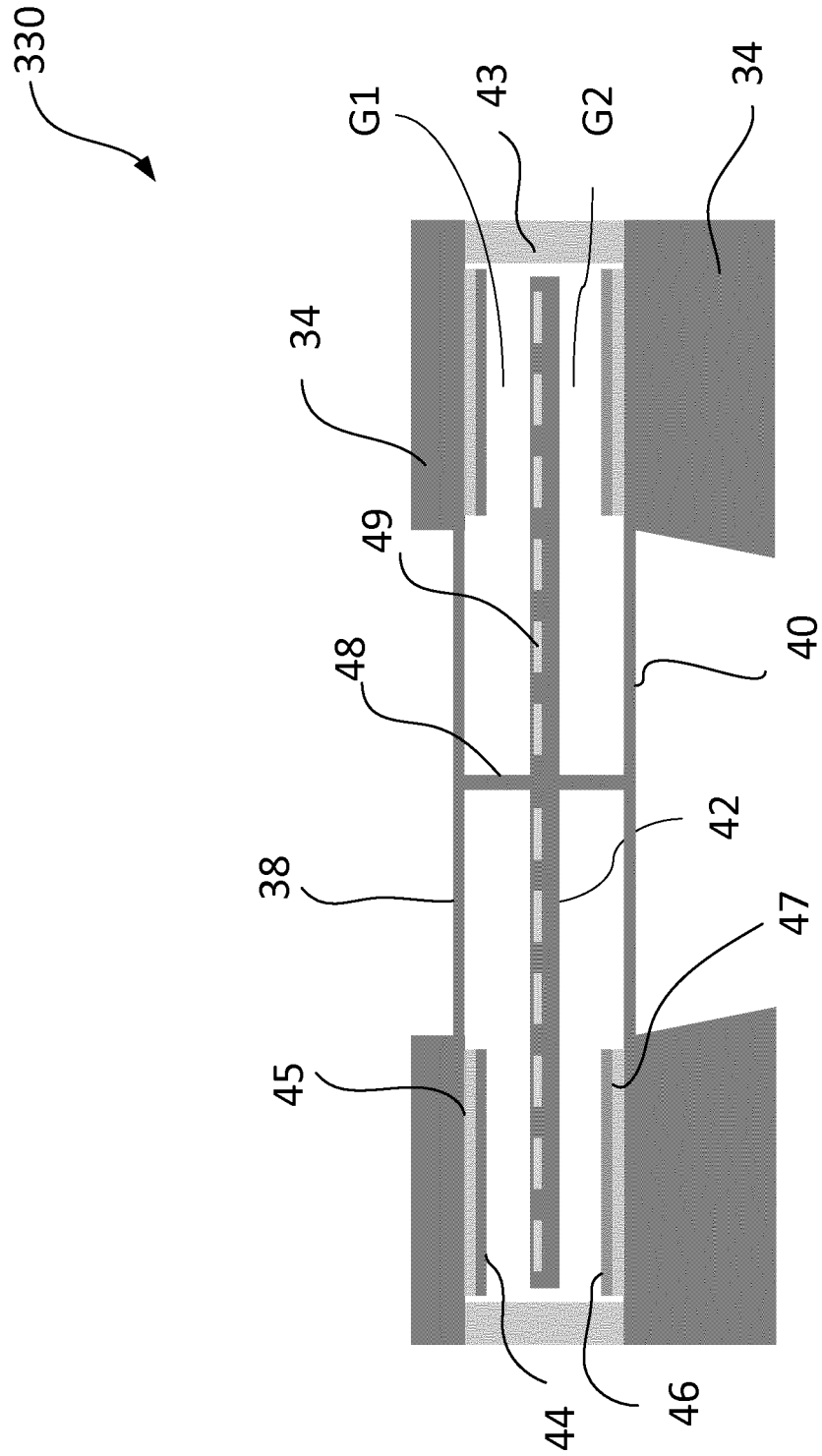
FIG. 6C is a cross-sectional view of of a microphone die in accordance with another exemplary embodiment of the disclosure.

FIGS. 6A-6C illustrate various exemplary embodiment of microphone die 330 of the disclosure. At least one terminal may be coupled to the microphone die 330 in suitable terminal configuration, as described in previous embodiments. The microphone die 330 is similar to the microphone die 30 illustrated in FIGS. 3A-3C except the microphone die 330 includes a stress gradient in the plate capacitor element 42 at rest position. When the length of the plate capacitor 42 increases or above a threshold or the thickness of the plate capacitor decreases or below a threshold, the capacitor element 42 may either bent upward toward the first diaphragm element 38 or downward toward the second diaphragm element 40. The stress gradient produces at a bending moment in the plate capacitor element 42 thereby causes the plate capacitor element 42 to bend. For example, gap G1 formed between the diaphragm element 38 and the plate capacitor element 48 depending on the bending direction is not equal to the gap G2 formed between the diaphragm element 40 and the plate capacitor element 42 due to the stress gradient and high electric field in the plate capacitor element 42 at rest position which results in an offset between the two electrode elements 44 and 46 and a smaller allowable or limited displacement of the moving element 42 due to possible premature pull-in and therefore smaller dynamic range of the microphone, depicted in FIGS. 6A and 6B. As the sound wave acting on one of the diaphragm elements 38, 40, causes the diaphragm elements 38, 40 to oscillate which in turn causes the plate capacitor element 42 to oscillate in phase as well, as capacitor element 42 is connected mechanically to diaphragm elements 38, 40 via the spacer. FIGS. 6A and 6B are identical except that in FIG. 6B, the electrode elements 44, 46 are alternated to compromise the curvature formed at the distal ends of the plate capacitor element 48. Coupled to the inner surface of the first diaphragm isolation 45 are electrode elements 44, 46 in proximal to the distal ends of the plate capacitor element 42, respectively. Opposite to the electrode element 44 is the electrode element 46 coupled to the second diaphragm isolation 47. A second set of the electrode element 44 diagonal to the electrode element 44 coupled to the first diaphragm isolation 45 is coupled to the second diaphragm isolation 47. The alternating electrode elements 44, 46 thereby contra the change in gap sensitivity differences as the plate capacitor element 42 oscillates.

Now referring to FIG. 6C, the microphone die is similar to the microphone die of FIGS. 6A and 6B with or without alternating electrode elements arrangement except that the microphone die 330 includes oxides 49 buried in the plate capacitor element 42 made from any suitable materials such as poly-silicon. Forming plate capacitor element 42 with oxides 49 buried therein not only reduces the curvature on the distal ends of the plate capacitor element 42 due to stress gradient, the oxides 49 buried in the plate capacitor element 42 particularly at the distal ends where curvature exist is counterbalanced. Depending on the curvature direction, the location where the oxides 49 is buried can be offset towards upper or lower surface of the plate capacitor element 42. In some embodiments, the thickness of the oxides can be turned to reduce the curvature.

Figure 7A:
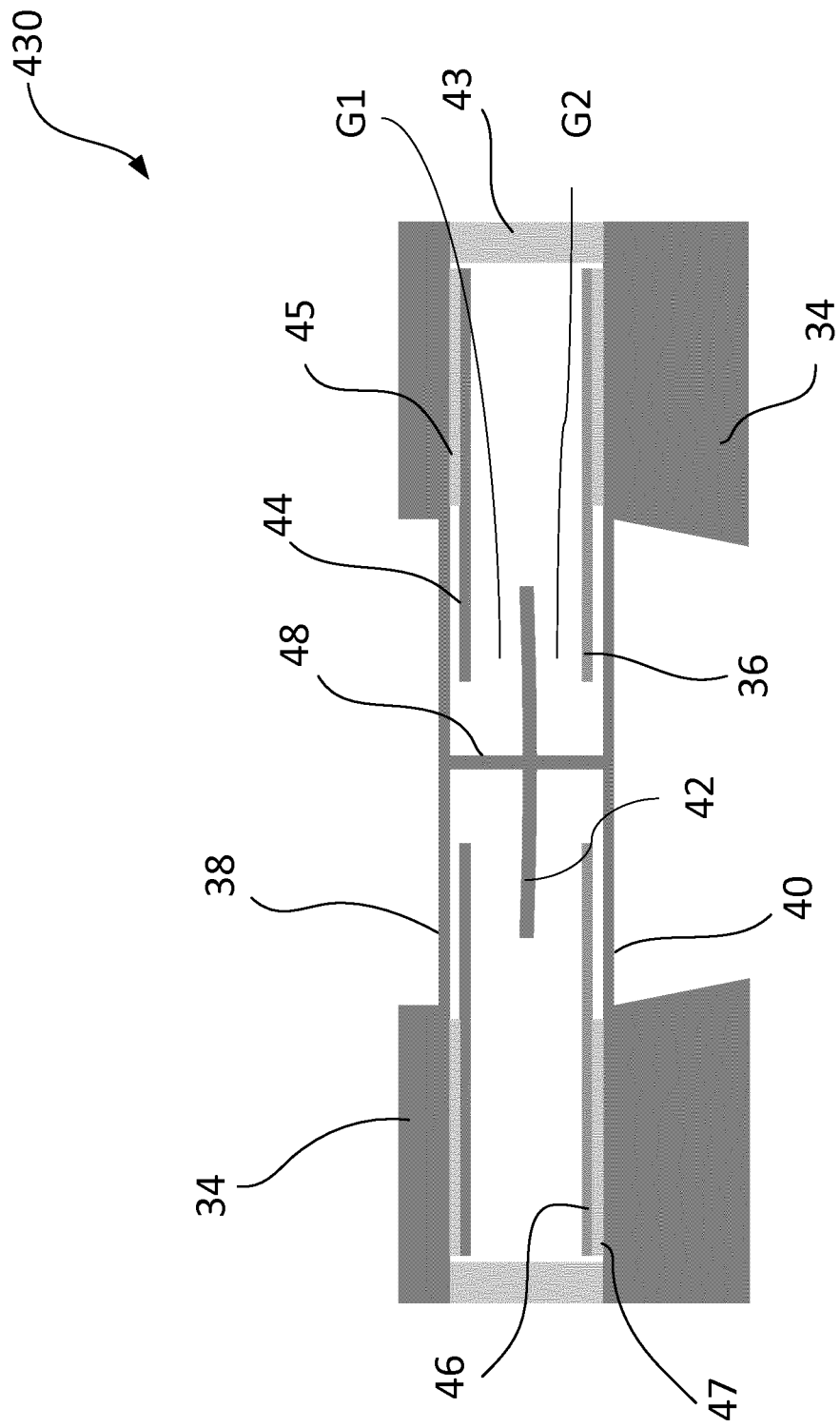
FIG. 7A is a cross-sectional view of a microphone die in accordance with another exemplary embodiment of the disclosure.
Figure 7B:
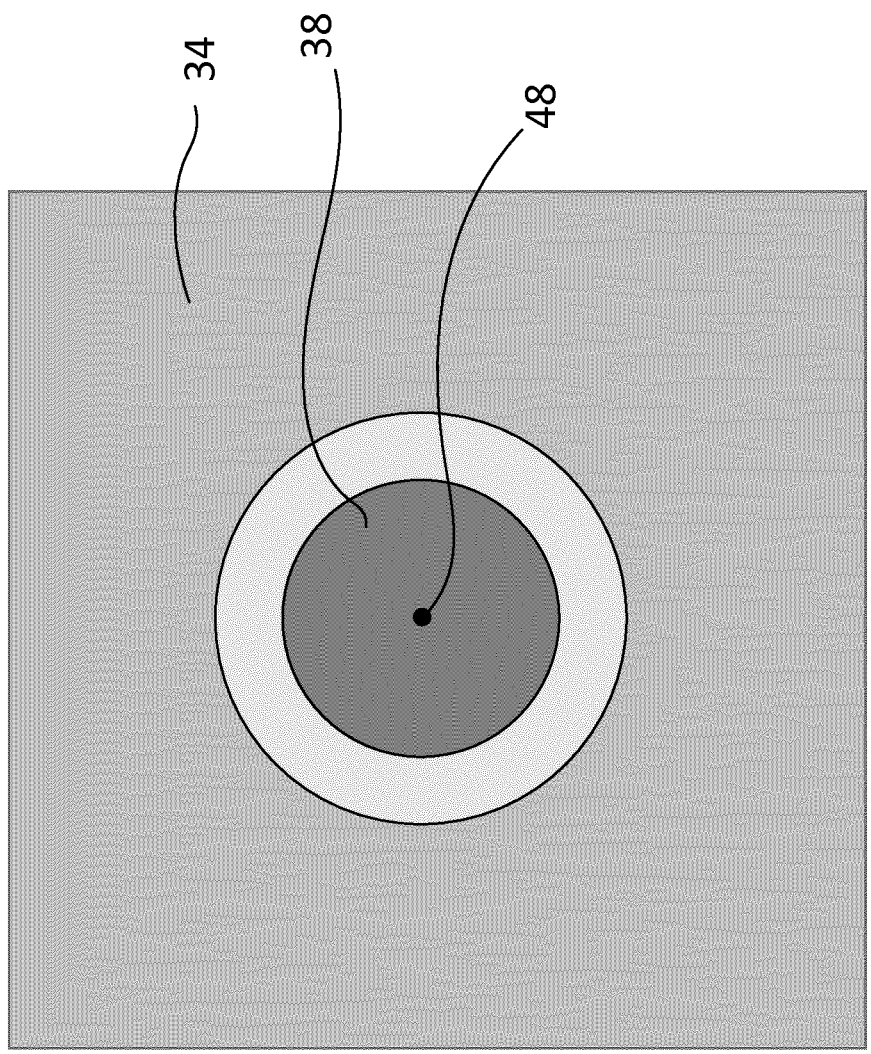
FIG. 7B is a top view of the microphone die of FIG. 7A thereof.

FIGS. 7A and 7B illustrate another microphone die 430 of the disclosure. At least one terminal may be coupled to the microphone die 430 in suitable terminal configuration, as described in previous embodiments. The microphone die 430 is similar to the microphone die 30 illustrated in FIGS. 3A-3C with the exception of the dimension wherein the plate capacitor element 42 has a length substantially shortly than or equal to the length of the electrode elements 44, 46. The isolations 45 and 47 include a length is shorter than the electrode elements 44, 46. In one embodiment, the isolations 45 and 47 may include a length equal to the plate capacitor element 42. As sound waves acting on one of the diaphragm elements 38, 40, the diaphragm elements 38, 40 deforms. The clearance for the oscillation movement of the diaphragm elements 38, 40 is limited by the electrode elements 44, 46. For the diaphragm elements 38, 40 deflection is smaller than the plate capacitor element 42, 46, the noise signal pressure level is distorted and wide or high dynamic range is achieved.

Figure 8A:
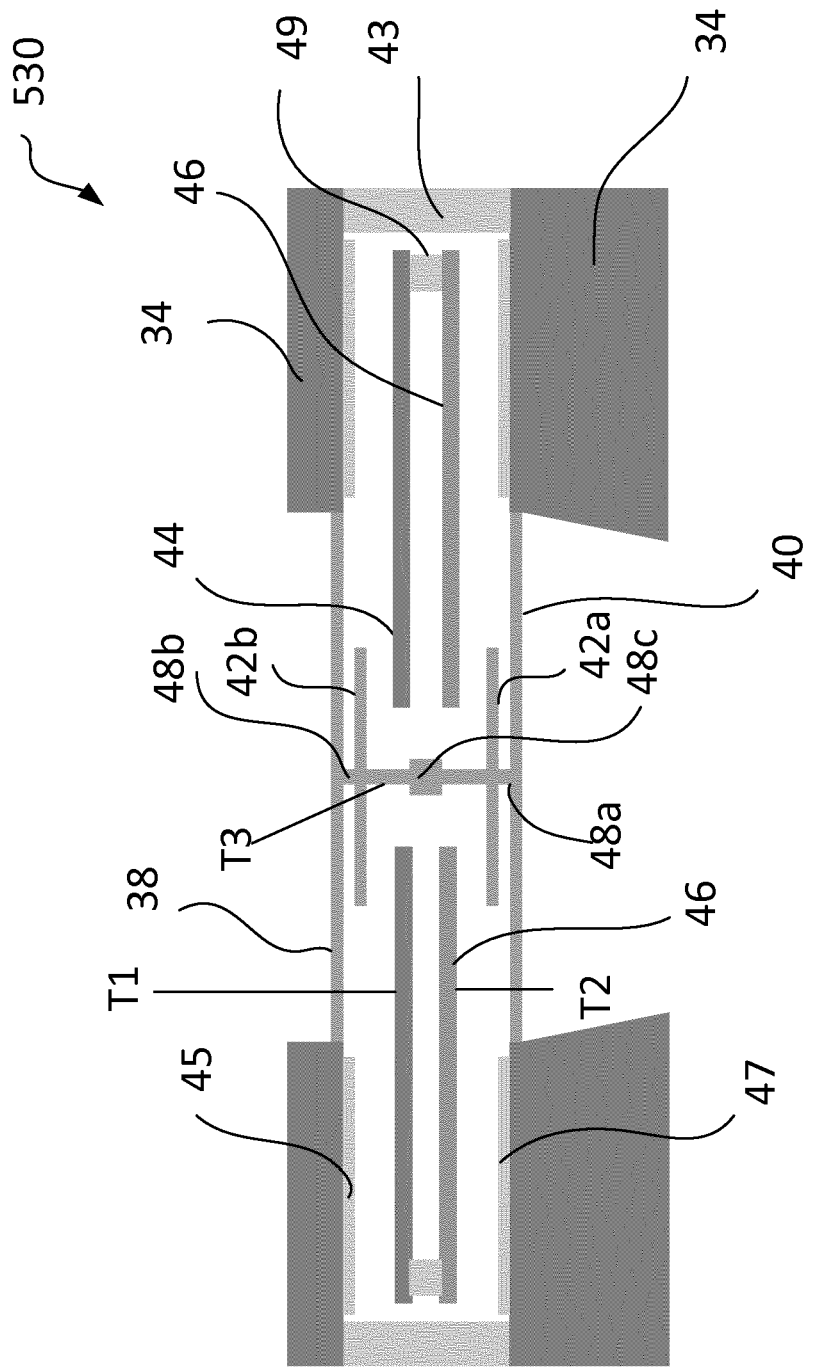
FIG. 8A is a cross-sectional view of a microphone die in accordance with another exemplary embodiment of the disclosure.
Figure 8B:
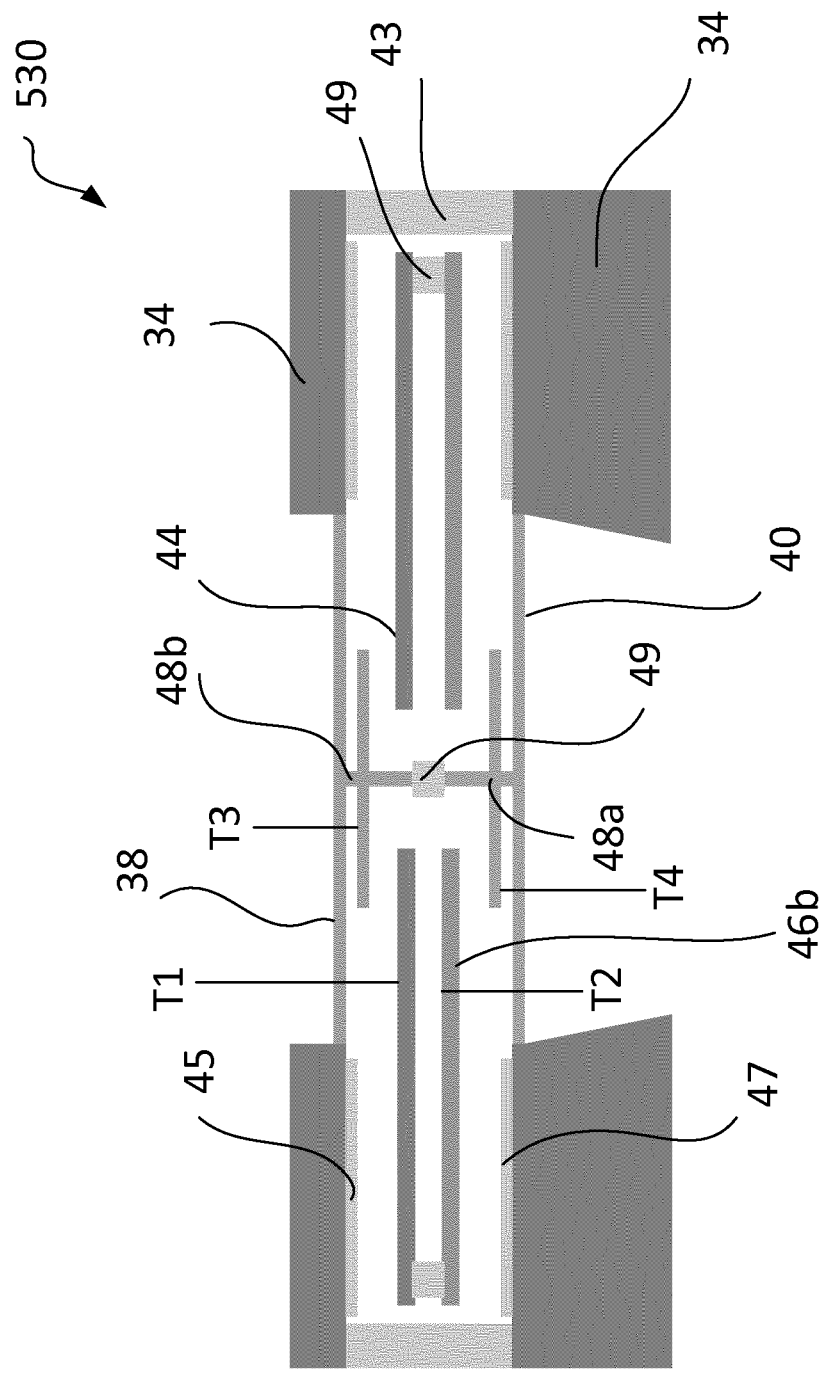
FIG. 8B is a cross-sectional view of a microphone die in accordance with another exemplary embodiment of the disclosure.

FIGS. 8A and 8B illustrate another microphone die 530 having 3-terminal configuration of the disclosure. The microphone die 530 is similar to the microphone die 230 illustrated in FIGS. 5A and 5B except the microphone die 530 includes dual plate capacitor elements 42a, 42b spaced parted by a spacer 48c. As depicted in FIG. 8A, a second spacer 48b is formed between the first diaphragm element 38 and the plate capacitor element 42a. Similarly, formed between second diaphragm element 40 and the plate capacitor element 42b is a third spacer 48a. The spacer 48c extends through an opening 80 formed within electrode elements 44, 46. The electrode elements 44, 46 overlap each other is spaced apart by an isolator 49 formed at distal ends of the electrode elements 44, 46. Terminal T1 is connected to the electrode element 44. Terminal T2 is connected to the electrode element 46 and terminal T3 is connected to a point in proximal to the spacer 48c of the dual plate capacitor element 42a, 42b.

Now referring to FIG. 8B, the spacer 48c formed between the dual plate capacitor elements 42a, 42b is replaced by the isolator 49. Two terminals T1, T2 are connected to the electrode elements 44, 46, respectively. Terminal T3 is connected to the plate capacitor element 42b and terminal T4 is connected to the plate capacitor element 42a.

Figure 9:
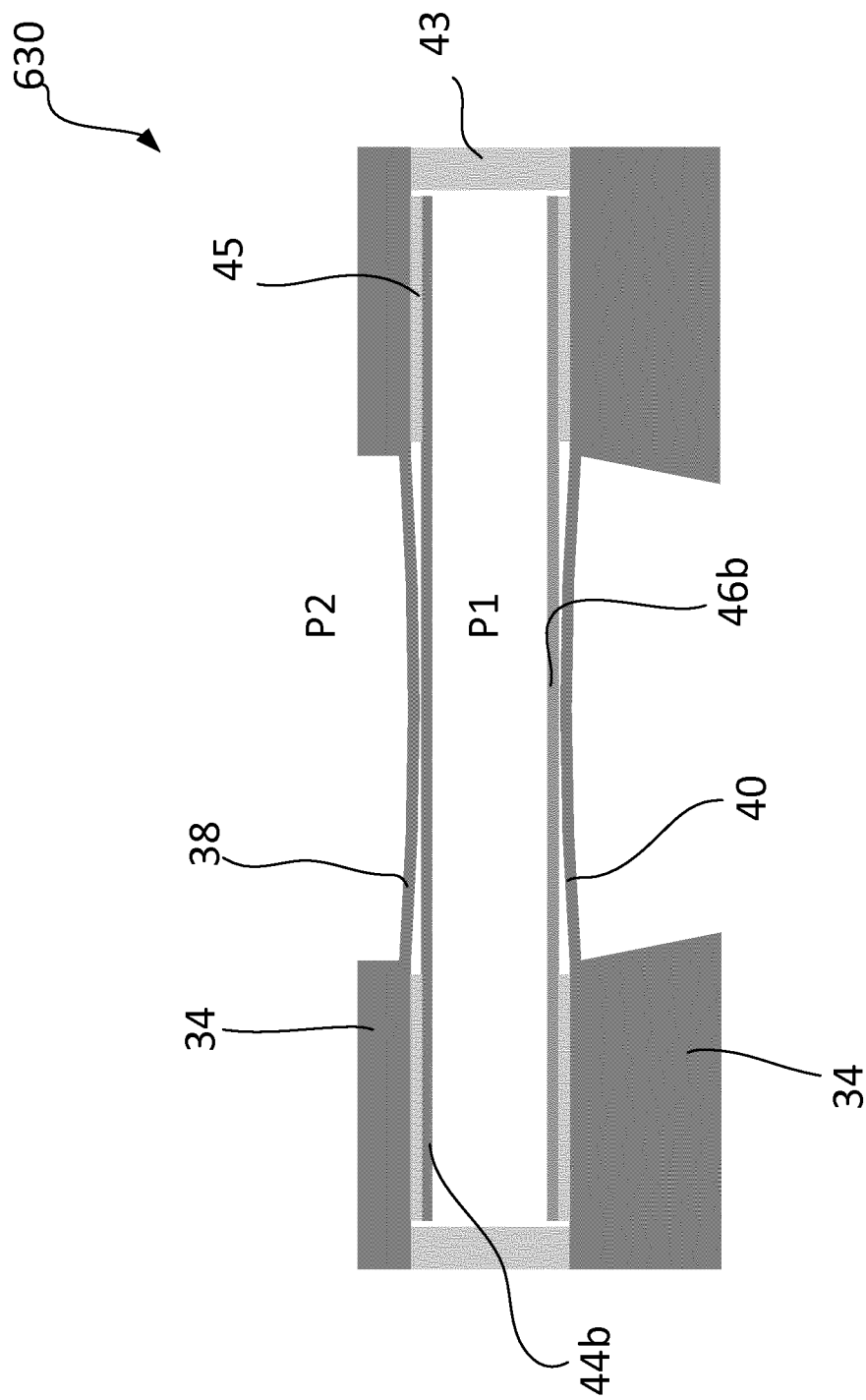
FIG. 9 is a cross-sectional view of a non-acoustic sensor such as a pressure sensor in accordance with an exemplary embodiment of the disclosure.

FIG. 9 illustrates an exemplary embodiment of a sensor such as a pressure sensor 630 of the disclosure. At least one terminal may be coupled to the pressure sensor 630 in suitable terminal configuration, as described in previous embodiments. Unlike from the previous embodiments, a plate capacitor element and the space coupled the plate capacitor element to the diaphragm elements 38, 40 are not required in the pressure sensor 630. The electrode elements 44b, 46b are coupled to the isolator elements 45, 46. In one embodiment, the electrode elements 44b, 46b without any opening may be coupled to the isolator elements 45, 46. In some embodiments, the pressure sensor 630 for a MEMS acoustic transducer comprises a top substrate 34 and a bottom substrate 34 spaced apart from each other and a driving system formed between the top substrate and the bottom substrate. The driving system comprises upper and lower diaphragms 38, 40 spaced apart from each other and upper and lower electrode elements 44b, 46b suspended to the upper and lower diaphragms 38, 40. The pressure sensor further comprises an insulator structure 43 formed between the top and bottom substrates, the insulator structure being disposed outside and enclosed the electrode elements. The driving system further comprises a first isolator coupled the upper electrode element to the top substrate and a second isolator coupled the lower electrode element to the bottom substrate. The electrode elements being suspended to the substrates via the isolators. Each of the electrode element comprising a central area and an outer area, the isolators coupled the outer area of each of the electrode element to the top and bottom substrates. Each of the diaphragm and the substrate are a monolithic structure. Each of the diaphragm comprises a central portion and an outer portion, the central portion of the diaphragm is configured to deflect in response to pressure signal. A clearance for the deflection of the diaphragm is limited by at least one of the isolator or the electrode element. The substrates of the pressure sensor comprises top and bottom cavities formed within and the central portion of each of the diaphragm is exposed for receiving the pressure signal. A portion of each of the substrate is configured to support the acoustic transducer.

The isolator is configured to separate and isolate the acoustic transducer from the pressure sensor. The pressure sensor and the acoustic transducer share the isolator. The remaining portion of each of the substrate is configured to support the pressure sensor.

Figure 10:
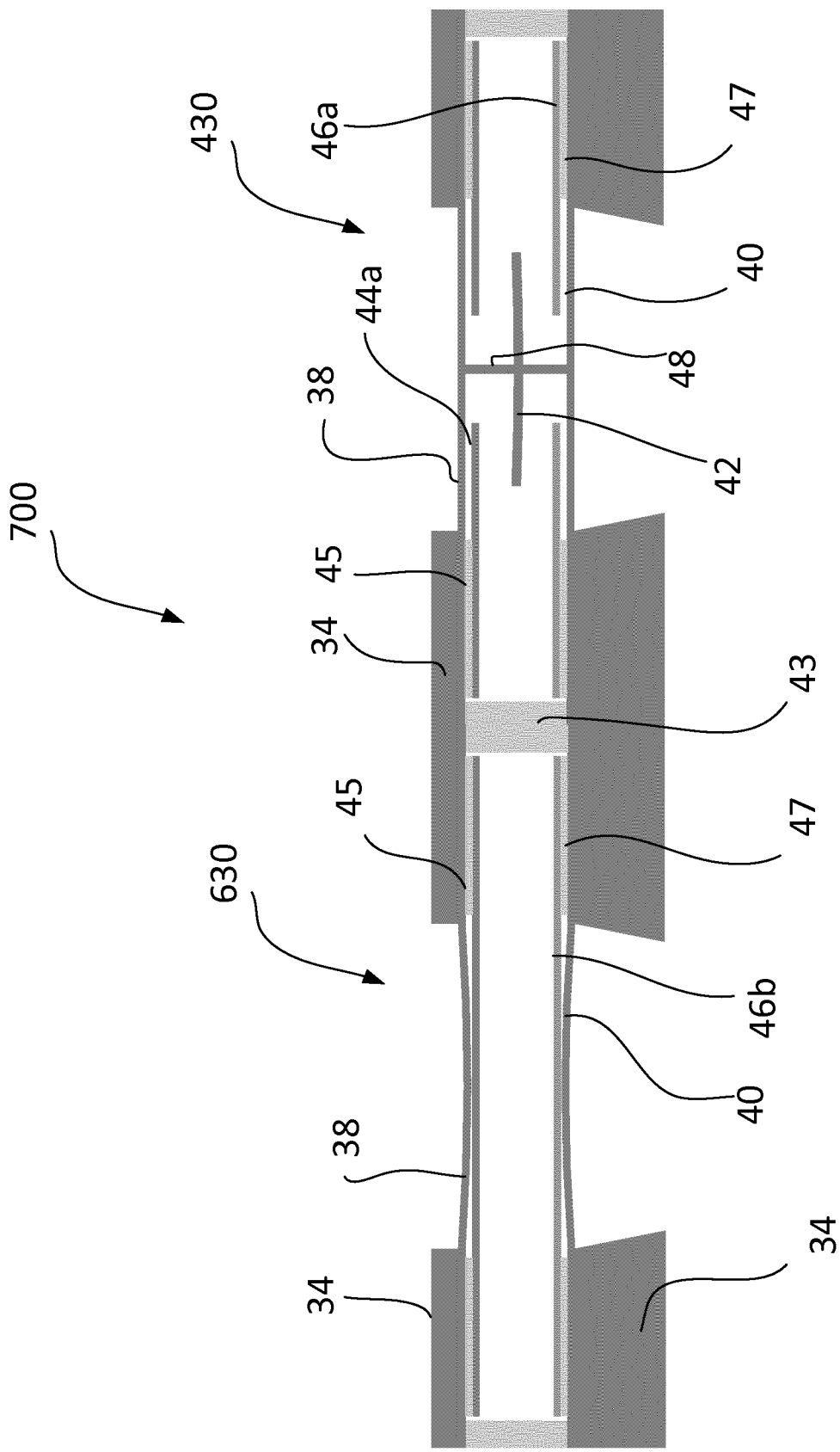
FIG. 10 is a cross-sectional view of a non-acoustic sensor such as a pressure sensor combined with a microphone die in accordance with another exemplary embodiment of the disclosure.

FIG. 10 illustrates a cross sectional view of a system 700 combining a pressure sensor 630 of FIG. 9 with a microphone die 430 of FIG. 7A of the disclosure. Other microphone die configuration described previously may be coupled to the pressure sensor 630. The microphone die 430 and the pressure sensor 630 are supported by the substrate 34. The microphone die 430 and the pressure sensor 630 mounted side by side shared an isolation 43. In one embodiment, the pressure sensor 630 has a diameter equal to the diameter of the microphone die 430. In another embodiment, pressure sensor 630 has a diameter small or greater the diameter of the microphone die 430. In some embodiments, the combo sensor system 700 comprises an acoustic transducer 430 and a pressure sensor 630. The pressure sensor 630 comprises a diaphragm assembly 38, 40 and a substrate assembly 34 being formed as a monolithic structure, defining a driving system and an electrode element assembly 44a, 46b suspended to the driving system. The combo sensor system 700 further comprises an insulator structure assembly 43 is disposed outside and enclosed the electrode element assembly. The driving system comprises an acoustic driving system and a pressure driving system. The electrode element assembly comprises a first electrode element assembly suspended to the acoustic driving system and a second electrode element assembly suspended to the pressure driving system. The insulator structure assembly comprising two openings formed within an outer wall and an inner wall for receiving at least one of driving system and the electrode element assembly, wherein the inner wall of the insulator structure assembly is configured to separate and isolate the acoustic driving system from the pressure driving system.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A combo sensor system comprising:
   a substrate assembly including a top substrate and a bottom substrate spaced apart from the top substrate;
   an acoustic transducer;
   a pressure sensor, the pressure sensor comprising:
      a pressure sensor diaphragm assembly integrally formed with the substrate assembly and defining a pressure sensor driving system; and a pressure sensor electrode element assembly mounted within the pressure sensor driving system; and an insulator structure assembly encircling the pressure sensor electrode element assembly.

2. The combo sensor system of claim 1, the acoustic transducer comprising:

an acoustic driving system formed from the top substrate and the bottom substrate, the acoustic driving system comprising:

upper and lower acoustic diaphragms spaced apart from each other; and upper and lower acoustic electrode elements suspended between the upper and lower acoustic diaphragms, wherein the insulator structure assembly encircles the upper and lower acoustic electrode elements.

3. The combo sensor system of claim 2 wherein the acoustic driving system further comprises:

a first isolator, the first isolator coupling the upper acoustic electrode element to the top substrate; and a second isolator, the second isolator coupling the lower acoustic electrode element to the bottom substrate.

4. The combo sensor system of claim 3 wherein the upper and lower acoustic electrode elements are suspended to the top and bottom substrates via the isolators.

5. The combo sensor system of claim 4 wherein each of the upper and lower acoustic electrode elements comprise a respective central area and a respective outer area, the first and second isolators coupling the respective outer areas of each of the upper and lower acoustic electrode elements to the top and bottom substrates, respectively.

6. The combo sensor system of claim 2 wherein the upper and lower acoustic diaphragms and the substrate assembly are a monolithic structure.

7. The combo sensor system of claim 6 wherein each of the upper and lower acoustic diaphragms include a respective central portion and a respective outer portion, the respective central portions configured to deflect in response to a pressure signal.

8. The combo sensor system of claim 7 wherein a clearance for the deflection of the upper diaphragm is limited by at least one of thea first isolator or the upper electrode element.

9. The combo sensor system of claim 8 wherein the top and bottom substrates include a top and a bottom cavity, respectively, positioned such that the central portion of each of the upper and lower acoustic diaphragms are exposed for receiving the pressure signal.

10. The combo sensor system of claim 9 wherein:

the first isolator couples the upper acoustic electrode element to the top substrate, the acoustic driving system further comprises a second isolator, which couples the lower acoustic electrode element to the bottom substrate, and the first and second isolators are configured to separate and isolate the acoustic transducer from the pressure sensor.

11. The combo sensor system of claim 9 wherein:

the first isolator couples the upper acoustic electrode element to the top substrate, the acoustic driving system further comprises a second isolator, which couples the lower acoustic electrode element to the bottom substrate, and wherein the pressure sensor and the acoustic transducer share the first and second isolators.

12. The combo sensor system of claim 2, wherein the insulator structure assembly comprises a first and second opening formed within an outer wall and an inner wall for receiving the pressure sensor electrode element and the acoustic transducer upper and lower acoustic electrode elements, respectively.

13. The combo sensor system of claim 12 wherein the inner wall of the insulator structure assembly is configured to separate and isolate the acoustic driving system from the pressure driving system.

* * * * *

UNITED STATES PATENT AND TRADEMARK OFFICE
CERTIFICATE OF CORRECTION

PATENT NO. : 10,934,160 B2
APPLICATION NO. : 16/461538
DATED : March 2, 2021
INVENTOR(S) : Doller et al.

Page 1 of 1

It is certified that error appears in the above-identified patent and that said Letters Patent is hereby corrected as shown below:

In the Claims
In Claim 8, at Column 12, Line 3: "thea first isolator" should read --a first isolator--.

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*